US012751300B2

(12) United States Patent
Kim et al.

(10) Patent No.: US 12,751,300 B2
(45) Date of Patent: Sep. 29, 2026

(54) SEMICONDUCTOR PACKAGE

(71) Applicant: SAMSUNG ELECTRONICS CO., LTD., Suwon-si (KR)

(72) Inventors: Minjin Kim, Suwon-si (KR); Seongho Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 18/615,675

(22) Filed: Mar. 25, 2024

(65) Prior Publication Data

US 2025/0038090 A1 Jan. 30, 2025

(30) Foreign Application Priority Data

Jul. 27, 2023 (KR) ........................ 10-2023-0098215

(51) Int. Cl.
*H10W 70/63* (2026.01)
*H10W 90/00* (2026.01)

(52) U.S. Cl.
CPC ......... *H10W 70/635* (2026.01); *H10W 90/00* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 6,285,079 | B1 | 9/2001 | Kunikiyo | |
| 9,390,992 | B2 | 7/2016 | Kwon et al. | |
| 9,589,908 | B1 | 3/2017 | Parmon | |
| 9,955,586 | B2 | 4/2018 | Wu et al. | |
| 10,396,036 | B2 | 8/2019 | Zhang et al. | |
| 11,233,014 | B2 | 1/2022 | Chen et al. | |
| 2023/0411268 | A1* | 12/2023 | Yoo | H10W 70/65 |
| 2024/0030175 | A1* | 1/2024 | Signorini | H10W 74/019 |

FOREIGN PATENT DOCUMENTS

| | | |
|---|---|---|
| KR | 10-0237330 | 1/2000 |
| KR | 10-2021-0011318 | 2/2021 |

* cited by examiner

*Primary Examiner* — Asok K Sarkar
(74) *Attorney, Agent, or Firm* — Fish & Richardson P.C.

(57) ABSTRACT

The present disclosure relates to semiconductor packages. An example semiconductor package comprises a package substrate that includes a signal pad and a ground pad, an interposer substrate on the package substrate, a semiconductor chip on the interposer substrate, a plurality of signal lines on a top surface of the package substrate, and a first connection terminal between the package substrate and the interposer substrate. Each signal line of the plurality of signal lines extends in a first direction. The plurality of signal lines and the signal pad are spaced apart in a second direction that intersects the first direction. The plurality of signal lines, the signal pad, and the ground pad are in contact with the top surface of the package substrate. The first connection terminal overlaps at least a portion of the plurality of signal lines in a plan view.

20 Claims, 7 Drawing Sheets

SEMICONDUCTOR PACKAGE

CROSS-REFERENCE TO RELATED APPLICATION

This application claims priority under 35 U.S.C § 119 to Korean Patent Application No. 10-2023-0098215 filed on Jul. 27, 2023, in the Korean Intellectual Property Office, the disclosure of which is hereby incorporated by reference in its entirety.

BACKGROUND

In the semiconductor industry, high capacity, thinness, and small size of semiconductor devices and electronic products using the same have been sought and thus various package techniques have been proposed. A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, the demand for high performance, high speed, and compact electronic products is increasing.

SUMMARY

The present disclosure relates to semiconductor packages, including a compact-sized semiconductor package that prevents crosstalk between signals.

In general, according to some aspects, a semiconductor package comprises: a package substrate that includes a signal pad and a ground pad; an interposer substrate on the package substrate; a semiconductor chip on the interposer substrate; a plurality of signal lines on a top surface of the package substrate; and a first connection terminal between the package substrate and the interposer substrate. Each of the signal lines extends in a first direction. The signal lines and the signal pad are spaced apart in a second direction that intersects the first direction. The signal lines, the signal pad, and the ground pad are in contact with the top surface of the package substrate. When viewed in plan, the first connection terminal overlaps at least a portion of the signal lines.

In general, according to some aspects, a semiconductor package comprises: a package substrate that includes a plurality of two-dimensionally arranged pads; an interposer substrate on the package substrate; a plurality of signal lines each of which extends in a first direction on the package substrate; a solder resist pattern that covers the signal lines and a top surface of the package substrate; a plurality of first connection terminals between the interposer substrate and the signal lines; and a plurality of second connection terminals between the interposer substrate and the pads. At least a portion of the solder resist pattern is between the first connection terminals and the signal lines. The signal lines are electrically insulated from the first connection terminals.

In general, according to some aspects, a semiconductor package comprises: a package substrate that includes a plurality of signal pads and a plurality of ground pads on a top surface of the package substrate; a logic chip on the package substrate; an interposer substrate between the logic chip and the package substrate, the interposer substrate including a first region and a second region; a plurality of signal lines between the interposer substrate and the package substrate; a solder resist pattern that covers the signal lines; and a plurality of connection terminals between the interposer substrate and the package substrate. When viewed in plan, the first region surrounds the second region. The signal lines extends from the first region to the second region. At least one of the connection terminals vertically overlaps the signal lines.

DETAILED DESCRIPTION

Figure 1:
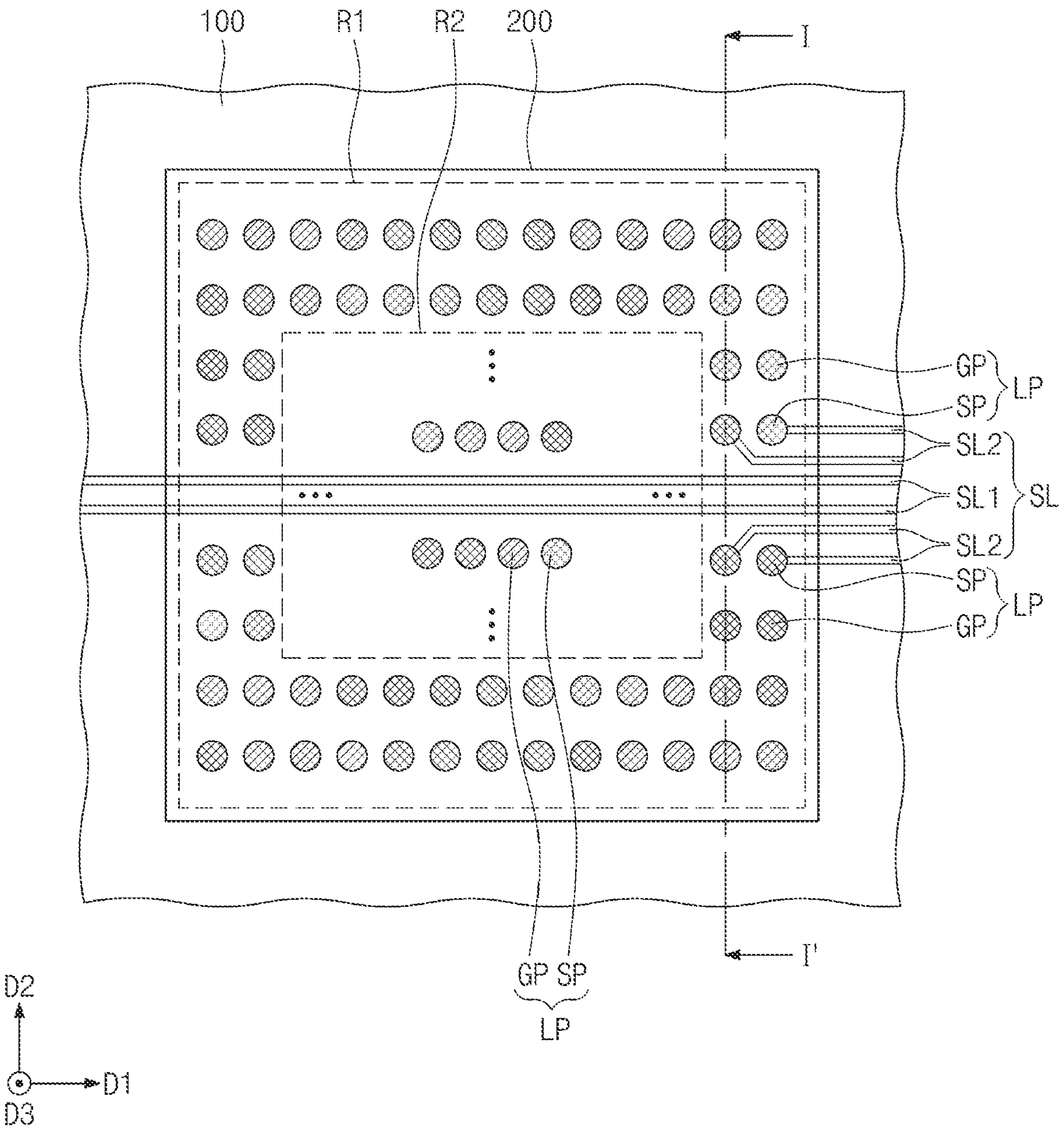
FIG. 1 illustrates a plan view showing an example of a semiconductor package.

The following will now describe some implementations of the present disclosure with reference to the accompanying drawings. Like reference numerals may indicate like components throughout the description.

Figure 2:
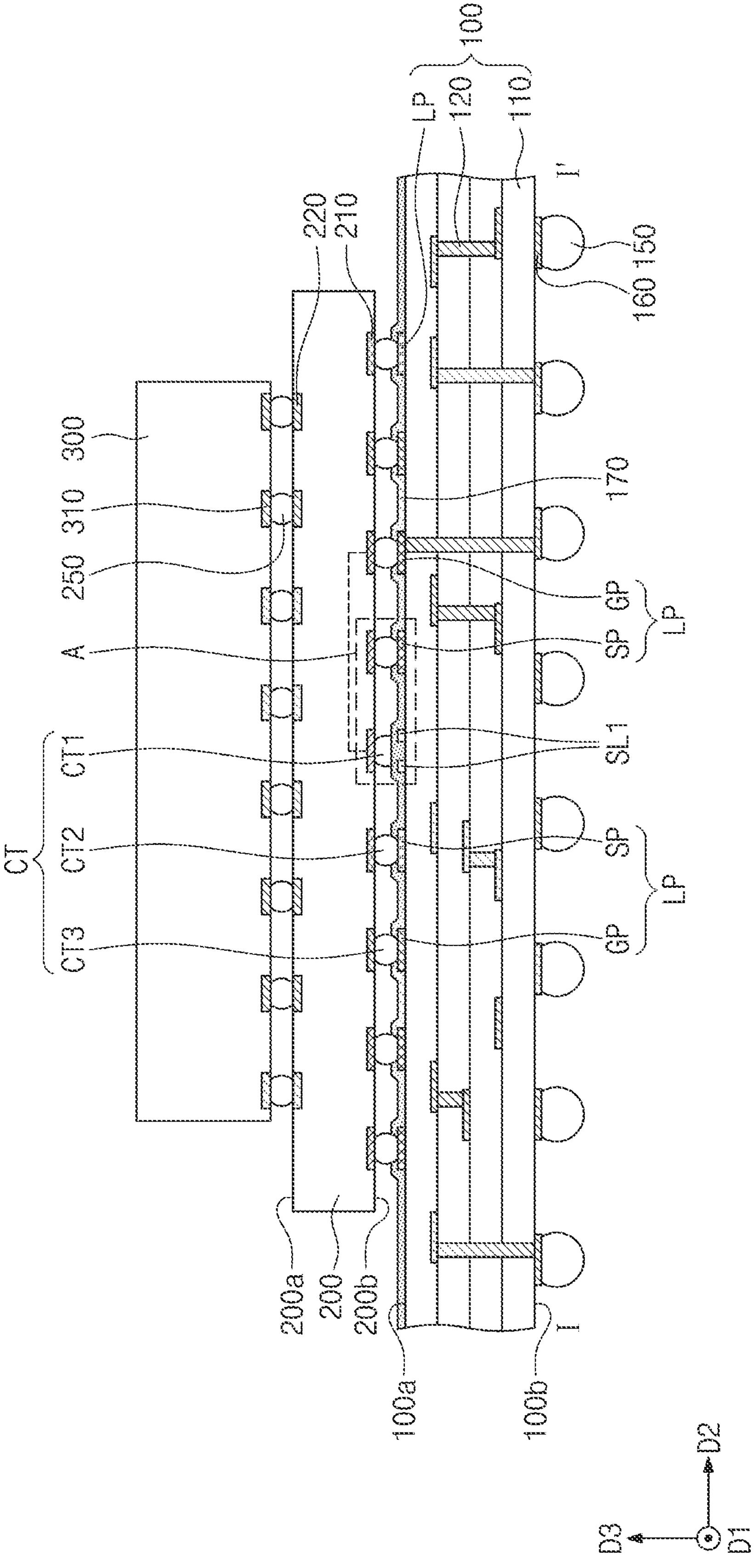
FIG. 2 illustrates an example cross-sectional view taken along line I-I' of FIG. 1.

FIG. 1 illustrates a plan view showing an example of a semiconductor package. FIG. 2 illustrates an example cross-sectional view taken along line I-I' of FIG. 1.

Referring to FIGS. 1 and 2, a semiconductor package may include a package substrate 100, an interposer substrate 200 on the package substrate 100, and a semiconductor chip 300 on the interposer substrate 200.

The package substrate 100 may be a dielectric substrate. The package substrate 100 may include a printed circuit board (PCB), but the present disclosure is not limited thereto. For example, the package substrate 100 may include a redistribution substrate and/or a semiconductor substrate. In this case, the package substrate 100 may be a bulk silicon substrate, a silicon-on-insulator (SOI) substrate, a germanium substrate, a germanium-on-insulator (GOI) substrate, a silicon-germanium substrate, or a substrate of a thin epitaxial layer obtained by performing selective epitaxial growth (SEG).

The package substrate 100 may include a dielectric layer 110, a conductive pattern 120, and a pad LP. The dielectric layer 110 may be provided in plural. The plurality of dielectric layers 110 may be stacked to contact each other. For example, even numbers of dielectric layers 110 may be provided, but the present disclosure is not limited thereto. The package substrate 100 may have a top surface 100*a* and a bottom surface 100*b*, which top and bottom surfaces 100*a* and 100*b* may be opposite to each other. The top surface 100*a* and the bottom surface 100*b* of the package substrate 100 may be parallel to a first direction D1 and a second direction D2. The top surface 100*a* and the bottom surface 100*b* of the package substrate 100 may be perpendicular to a third direction D3.

The conductive pattern 120 may be disposed in the dielectric layer 110. The conductive pattern 120 may include a conductive line and a conductive via. The conductive line may be positioned on one of top and bottom surfaces of the dielectric layer 110. The conductive line may extend in the first direction D1 or the second direction D2. The conductive via may penetrate the dielectric layer 110. When the dielectric layer 110 is provided in plural, the conductive via may penetrate one or more dielectric layers 110. The conductive pattern 120 may be provided in plural. The plurality of conductive patterns 120 may be electrically connected to each other. For example, the conductive pattern 120 may include a metallic material, such as copper (Cu).

The pad LP may be disposed on and in contact with the first surface 100*a* of the package substrate 100. The pad LP may be electrically connected to the conductive pattern 120. The pad LP may be provided in plural. The plurality of pads LP may be spaced apart from each other in the first and second directions D1 and D2. When viewed in plan, the plurality of pads LP may be two-dimensionally arranged.

The pad LP may include a signal pad SP and a ground pad GP. The signal pad SP may electrically connect the semiconductor chip 300 on the interposer substrate 200 to the package substrate 100. The semiconductor chip 300 may receive or transmit through the signal pad SP at least one selected from command signals, access signals, and data signals from the package substrate 100. A signal applied to the signal pad SP may have a frequency of about 8 GHz to about 10 GHz. The ground pad GP may be supplied with a power voltage or a ground voltage. When the pad LP is provided in plural, a plurality of ground pads GP may be disposed most adjacent to a plurality of signal pads SP. When viewed in plan, the ground pads GP may surround the signal pads SP. At least one of the pads LP most adjacent to the signal pad SP may be the ground pad GP.

An external connection terminal 150 and an under-bump pad 160 may be provided on the bottom surface 100*b* of the package substrate 100. The under-bump pad 160 may be in contact with the bottom surface 100*b* of the package substrate 100, and the external connection terminal 150 may be in contact with the under-bump pad 160. For example, the under-bump pad 160 may be positioned between the external connection terminal 150 and the bottom surface 100*b* of the package substrate 100. The external connection terminal 150 and the under-bump pad 160 may vertically overlap each other. The under-bump pad 160 may be electrically connected to the conductive pattern 120 of the package substrate 100. Therefore, the package substrate 100 may be electrically connected through the under-bump pad 160 and the external connection terminal 150 to an external electronic apparatus or a different semiconductor package. Each of the external connection terminal 150 and the under-bump pad 160 may be provided in plural, and the plurality of under-bump pads 160 that correspond to the plurality of external connection terminals 150 may vertically overlap each other.

The interposer substrate 200 may be positioned on the package substrate 100, and may include a lower pad 210 and an upper pad 220. The interposer substrate 200 may have a top surface 200*a* and a bottom surface 200*b* that are opposite to each other. The lower pad 210 may be provided on the bottom surface 200*b* of the interposer substrate 200, and the upper pad 220 may be provided on the top surface 200*a* of the interposer substrate 200. For example, the bottom surface 200*b* of the interposer substrate 200 may outwardly expose the lower pad 210, and the top surface 200*a* of the interposer substrate 200 may outwardly expose the upper pad 220. The upper pad 220 and the lower pad 210 may be electrically connected to each other. Each of the upper and lower pads 220 and 210 may be provided in plural. The plurality of upper pads 220 may be spaced apart from each other in the first and second directions D1 and D2, and likewise the plurality of lower pads 210 may be spaced apart from each other in the first and second directions D1 and D2.

The interposer substrate 200 may include a first region R1 and a second region R2. When viewed in plan, the first region R1 may surround the second region R2. For example, the first region R1 may correspond to an edge region of the interposer substrate 200, and the second region R2 may correspond to a central region of the interposer substrate 200. The first region R1 may be defined to indicate a region on which are positioned two pads LP that are disposed side by side in the first direction D1 or the second direction D2 from an outermost one of the pads LP. The second region R2 may be defined to indicate a region other than the first region R1. The present disclosure, however, is not limited thereto, and the first region R1 may be defined to indicate a region on which are positioned three or more pads LP that are disposed side by side in the first direction D1 or the second direction D2 from an outermost one of the pads LP. The interposer substrate 200 may vertically overlap the pads LP of the package substrate 100.

A signal line SL may be provided between the interposer substrate 200 and the package substrate 100. The signal line SL may be positioned on and in contact with the top surface 100*a* of the package substrate 100. The signal line SL may include a first signal line SL1 and a second signal line SL2. The first signal line SL1 may be provided in plural. The first signal lines SL1 may extend in the first direction D1, and may be spaced apart from each other in the second direction D2. The first signal lines SL1 may extend from the first region R1 to the second region R2 of the interposer substrate 200. When viewed in plan, the first signal lines SL1 may pass through the interposer substrate 200.

The second signal line SL2 may be provided in plural. Unlike the first signal lines SL1, the second signal lines SL2 may not extend from the first region R1 to the second region R2 of the interposer substrate 200. The second signal lines SL2 may be disposed only on the second region R2, and may be correspondingly connected to the signal pads SP.

The first signal lines SL1 may be connected to a different semiconductor chip on the package substrate 100 or the conductive pattern 120 of the package substrate 100, while passing below the interposer substrate 200. Alternatively, the first signal lines SL1 may be connected to the pads LP of the package substrate 100. The first signal lines SL1 may be adjacent to each other and positioned between the pads LP, or the pads LP may be disposed between the first signal lines SL1. The first signal lines SL1 may be positioned between the second signal lines SL2. The present disclosure, however, is not limited thereto. For example, the first and second signal lines SL1 and SL2 may be provided in various ways based on design of the package substrate 100.

In some implementations, as the semiconductor package includes the signal line SL on the top surface 100*a* of the package substrate 100, there may be a reduction in the number of the plurality of dielectric layers 110 required for the package substrate 100 and in the number of the conductive patterns 120 in the plurality of dielectric layers 110. In this sense, as the package substrate 100 has a simplified structure, the package substrate 100 may have a small size. Accordingly, the semiconductor package may become compact-sized.

A connection terminal CT may be provided between the interposer substrate 200 and the package substrate 100. For example, the connection terminal CT may be positioned between and electrically connect the pad LP of the package substrate 100 and the lower pad 210 of the interposer substrate 200. The connection terminal CT may include one or more of tin (Sn), silver (Ag), copper (Cu), zinc (Zn), lead (Pb), and any alloy thereof.

The connection terminal CT may be provided in plural, and may include a first connection terminal CT1, a second connection terminal CT2, and a third connection terminal CT3. The first connection terminal CT1 may be positioned on the signal line SL, and may vertically overlap at least a portion of the signal line SL. The second connection terminal CT2 may be positioned on the signal pad SP, and may vertically overlap at least a portion of the signal pad SP. The third connection terminal CT3 may be disposed on and vertically overlap the ground pad GP. The first connection terminal CT1 may be electrically connected to the interposer substrate 200 through one of neighboring third connection terminals CT3. For example, the second and third connection terminals CT2 and CT3 may have substantially the same size and shape.

A solder resist pattern 170 may be provided between the interposer substrate 200 and the package substrate 100, and may cover the top surface 100*a* of the package substrate 100. The solder resist pattern 170 may be spaced apart from the bottom surface 200*b* of the interposer substrate 200. For example, the solder resist pattern 170 may include a dielectric material, such as a solder resist.

The semiconductor chip 300 may be positioned on the interposer substrate 200, and may include a chip pad 310. For example, the semiconductor chip 300 may be a logic chip. The logic chip may include an applicant specific integrated circuit (ASIC) chip or an application processor (AP) chip. Alternatively, the logic chip may include a central processing unit (CPU) or a graphic processing unit (GPU). The ASIC chip may include an application specific integrated circuit (ASIC). The chip pad 310 may be disposed on a bottom surface of the semiconductor chip 300, and may be provided in plural.

A plurality of bumps 250 may be provided between the semiconductor chip 300 and the interposer substrate 200, and each of the plurality of bumps 250 may be connected to a corresponding chip pad 310 of the semiconductor chip 300 and a corresponding upper pad 220 of the interposer substrate 200. Thus, the semiconductor chip 300 and the interposer substrate 200 may be electrically connected to each other, and the semiconductor chip 300 may be electrically connected through the interposer substrate 200 to the package substrate 100.

In some implementations, an underfill layer may be provided between the semiconductor chip 300 and the interposer substrate 200. The underfill layer may surround a plurality of bumps 250. Therefore, the plurality of bumps 250 may be spaced apart from each other, and the semiconductor chip 300 and the interposer substrate 200 may have increased durability.

Figure 3A:
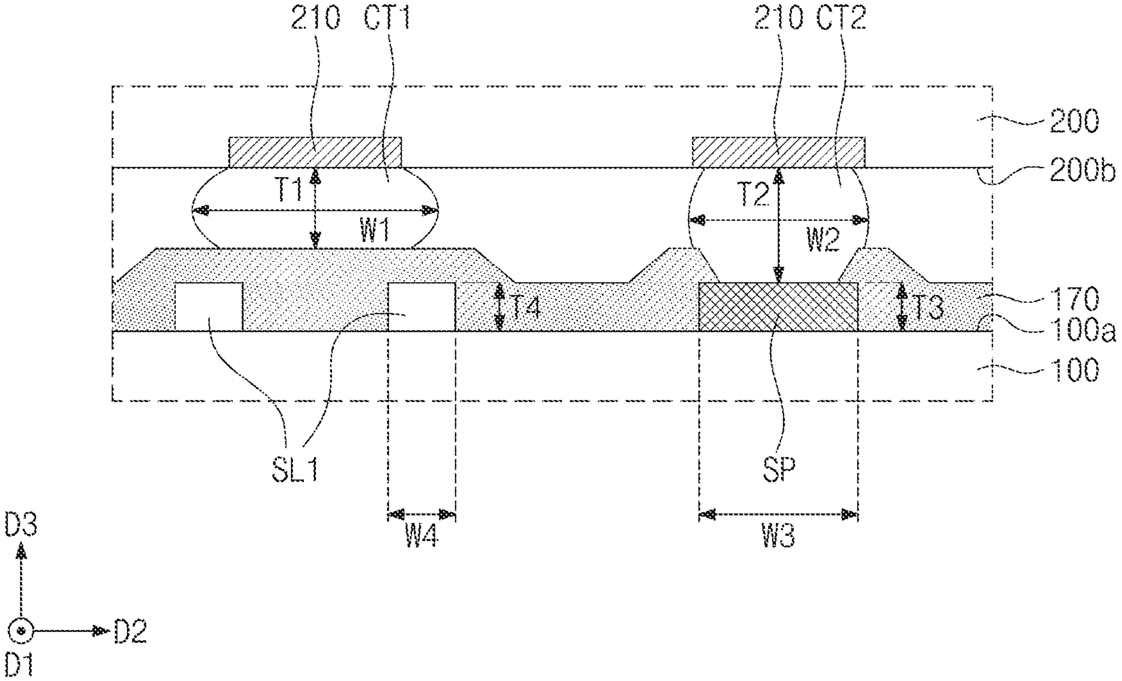
FIGS. 3A and 3B illustrate example enlarged views of section A depicted in FIG. 2.
Figure 3B:
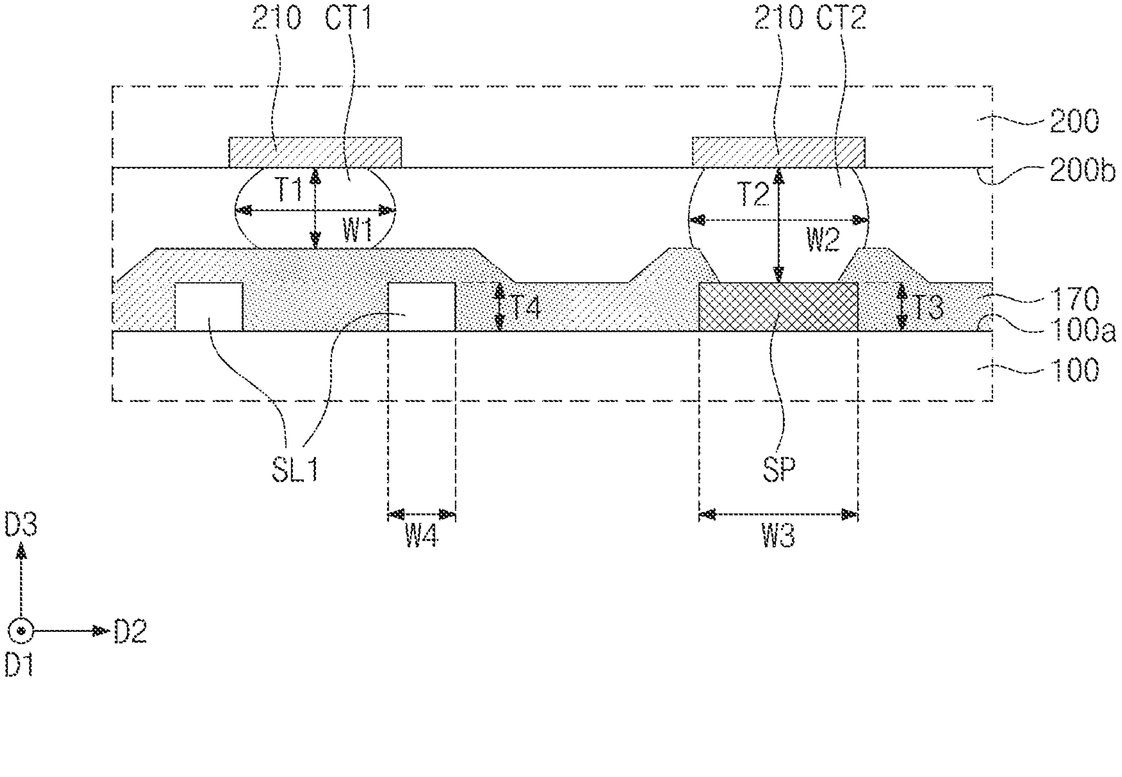

FIGS. 3A and 3B illustrate example enlarged views of section A depicted in FIG. 2.

Referring to FIG. 3A, the solder resist pattern 170 on the package substrate 100 may cover the first signal lines SL1. The solder resist pattern 170 may cover a portion of the signal pad SP, while covering a remaining portion of the signal pad SP. For example, the solder resist pattern 170 may be provided between the first connection terminal CT1 and the first signal lines SL1, but may be excluded between the second connection terminal CT2 and the signal pad SP. Alternatively, the solder resist pattern 170 may be spaced apart from and in no contact with the signal pad SP.

The first connection terminal CT1 may be disposed between the first signal lines SL1 and the lower pad 210. The first connection terminal CT1 may be in contact with the lower pad 210, but may be spaced apart in the third direction D3 from the first signal lines SL1. For example, the first connection terminal CT1 and the first signal line SL1 may be electrically insulated from each other by the solder resist pattern 170 provided therebetween. The first connection terminal CT1 may vertically overlap the lower pad 210 and at least a portion of the first signal lines SL1. The first connection terminal CT1 may have a first width W1 in the second direction D2. The first connection terminal CT1 may have a first thickness T1 in the third direction D3.

The second connection terminal CT2 may be disposed between and in contact with the signal pad SP and the lower pad 210. The second connection terminal CT2 may vertically overlap the signal pad SP and the lower pad 210. The second connection terminal CT2 may have a second width W2 in the second direction D2. The second connection terminal CT2 may have a second thickness T2 in the third direction D3.

The solder resist pattern 170 may be provided between the first signal lines SL1 and the first connection terminal CT1 and excluded between signal pad SP and the second connection terminal CT2, and thus the first thickness T1 may be less than the second thickness T2. When the first connection terminal CT1 and the second connection terminal CT2 are formed to have substantially the same size, the first width W1 may be greater than the second width W2.

The signal pad SP may have a third width W3 in the second direction D2. The signal pad SP may have a third thickness T3 in the third direction D3. Each of the first signal lines SL1 may have a fourth width W4 in the second direction D2. Each of the first signal lines SL1 may have a fourth thickness T4 in the third direction D3. The third width W3 may be greater than the fourth width W4. The third thickness T3 may be substantially the same as the fourth thickness T4. For example, the fourth width W4 may be about 40 μm, and the fourth thickness T4 may be about 20 μm.

As the signal pad SP and the first signal lines SL1 have the same thickness while being in contact with the top surface 100*a* of the package substrate 100, a top surface of the signal pad SP and top surfaces of the first signal lines SL1 may be located at the same level.

Referring to FIG. 3B, the first connection terminal CT1 may have a first width W1 in the second direction D2 and a first thickness T1 in the third direction D3. The second connection terminal CT2 may have a second width W2 in the second direction D2 and a second thickness T2 in the third direction D3. As the solder resist pattern 170 is provided between the first connection terminal CT1 and the first signal lines SL1, the first thickness T1 may be less than the second thickness T2. Unlike FIG. 3A, the first width W1 may be substantially the same as the second width W2.

The first connection terminal CT1 and the second connection terminal CT2 may be formed to have different sizes from each other, and the size of the first connection terminal CT1 may be less than the size of the second connection terminal CT2. Therefore, even though the first thickness T1 is less than the second thickness T2, the first width W1 may be substantially the same as the second width W2.

Referring to FIGS. 1 to 3B, the first signal line SL1 may be disposed adjacent to the signal pads SP, and the first connection terminal CT1 may be provided on the first signal line SL1. The first connection terminal CT1 may be electrically connected through the interposer substrate 200 to the third connection terminal CT3 adjacent thereto. For example, the first connection terminal CT1 may have a function substantially the same as that of the third connection terminal CT3. A crosstalk may be prevented between signals applied to the signal pads SP. It may thus be possible to provide a compact-sized semiconductor package capable of preventing a crosstalk between signals.

Accordingly, the first connection terminal CT1 may be required to have an appropriate size. When the first connection terminal CT1 is excessively small, a crosstalk may not be prevented between signals, and when the first connection terminal CT1 is dramatically large, a semiconductor package may become large in size. For example, the first width W1 may range from about 200 μm to about 300 μm. The first thickness T1 may range from about 150 μm to about 250 μm.

Figure 4:
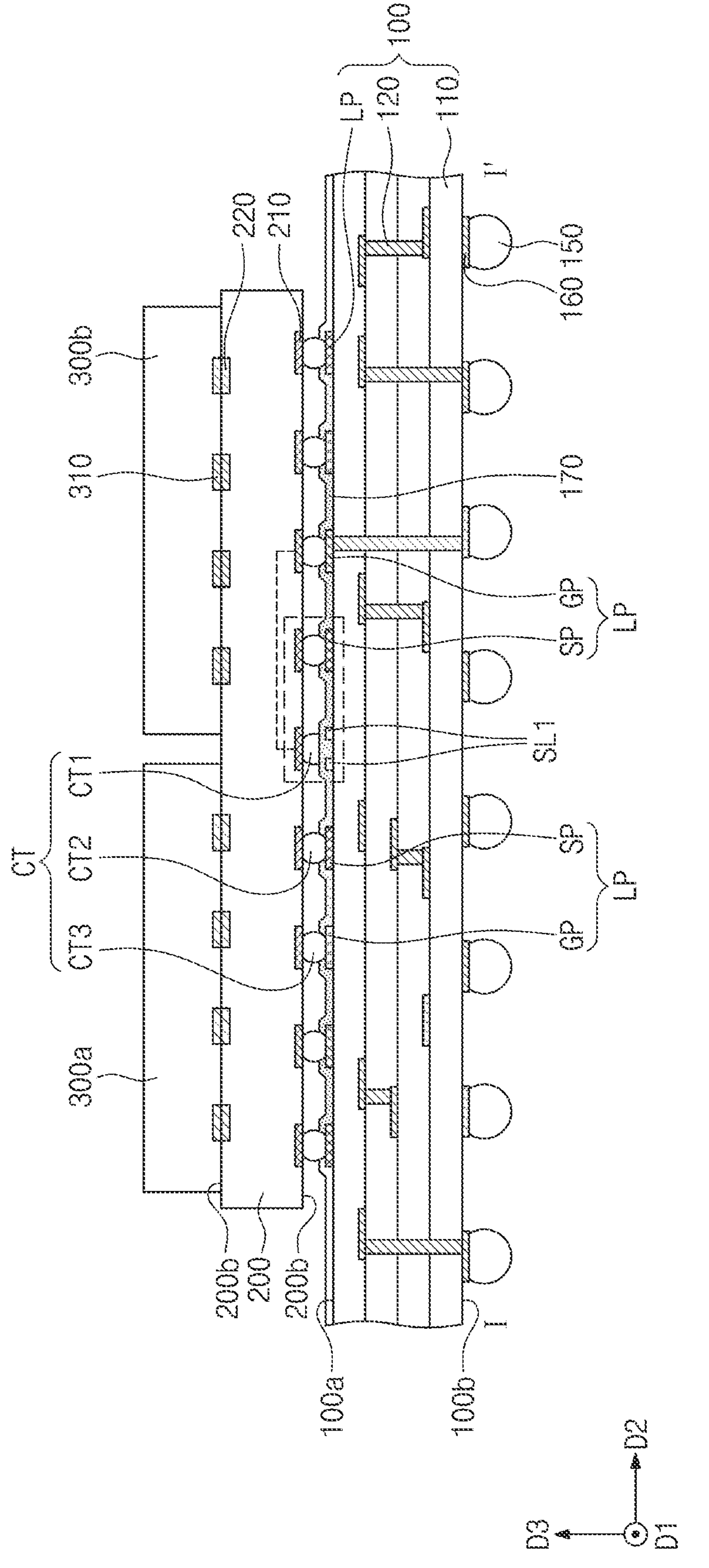
FIG. 4 illustrates an example cross-sectional view taken along line I-I' of FIG. 2.

FIG. 4 illustrates an example cross-sectional view taken along line I-I' of FIG. 2.

In the implementation that follows, a detailed description of technical features repetitive to those discussed above with reference to FIGS. 1 to 3B will be omitted, and a difference thereof will be explained in detail.

Referring to FIG. 4, a plurality of semiconductor chips 300*a* and 300*b* may be provided on a package substrate 100 and an interposer substrate 200. The package substrate 100 and the interposer substrate 200 may be substantially the same as those discussed in FIGS. 1 to 3B. For example, a semiconductor package may include a first semiconductor chip 300*a* and a second semiconductor chip 300*b*. The first semiconductor chip 300*a* and the second semiconductor chip 300*b* may be disposed on the interposer substrate 200. The first semiconductor chip 300*a* and the second semiconductor chip 300*b* may be spaced apart from each other in the second direction D2. The first semiconductor chip 300*a* and the second semiconductor chip 300*b* may be semiconductor chips of the same or different types. For example, the first semiconductor chip 300*a* and the second semiconductor chip 300*b* may be a logic chip or a memory chip, or one of the first and second semiconductor chips 300*a* and 300*b* may be a memory chip and the other of the first and second semiconductor chips 300*a* and 300*b* may be a logic chip.

The first semiconductor chip 300*a* and the second semiconductor chip 300*b* may be in direct contact with the interposer substrate 200. For example, a plurality of bumps 250 depicted in FIG. 2 may be omitted on the interposer substrate 200. In this case, an intermetallic hybrid bonding may be achieved between upper pads 220 of the interposer substrate 200 and chip pads 310 of the first and second semiconductor chips 300*a* and 300*b*. In this description, the term "hybrid bonding" may denote a bonding in which two components of the same kind are merged at an interface therebetween. For example, the chip pad 310 and the upper pad 220 may have a continuous configuration, and an invisible interface may be provided between the chip pad 310 and the upper pad 220. In addition, the chip pad 310 and the upper pad 220 may be formed of the same material, and may be combined with each other to form a single object.

Alternatively, the first semiconductor chip 300*a* and the second semiconductor chip 300*b* may be electrically connected through a bonding wire to the interposer substrate 200.

Figure 5:
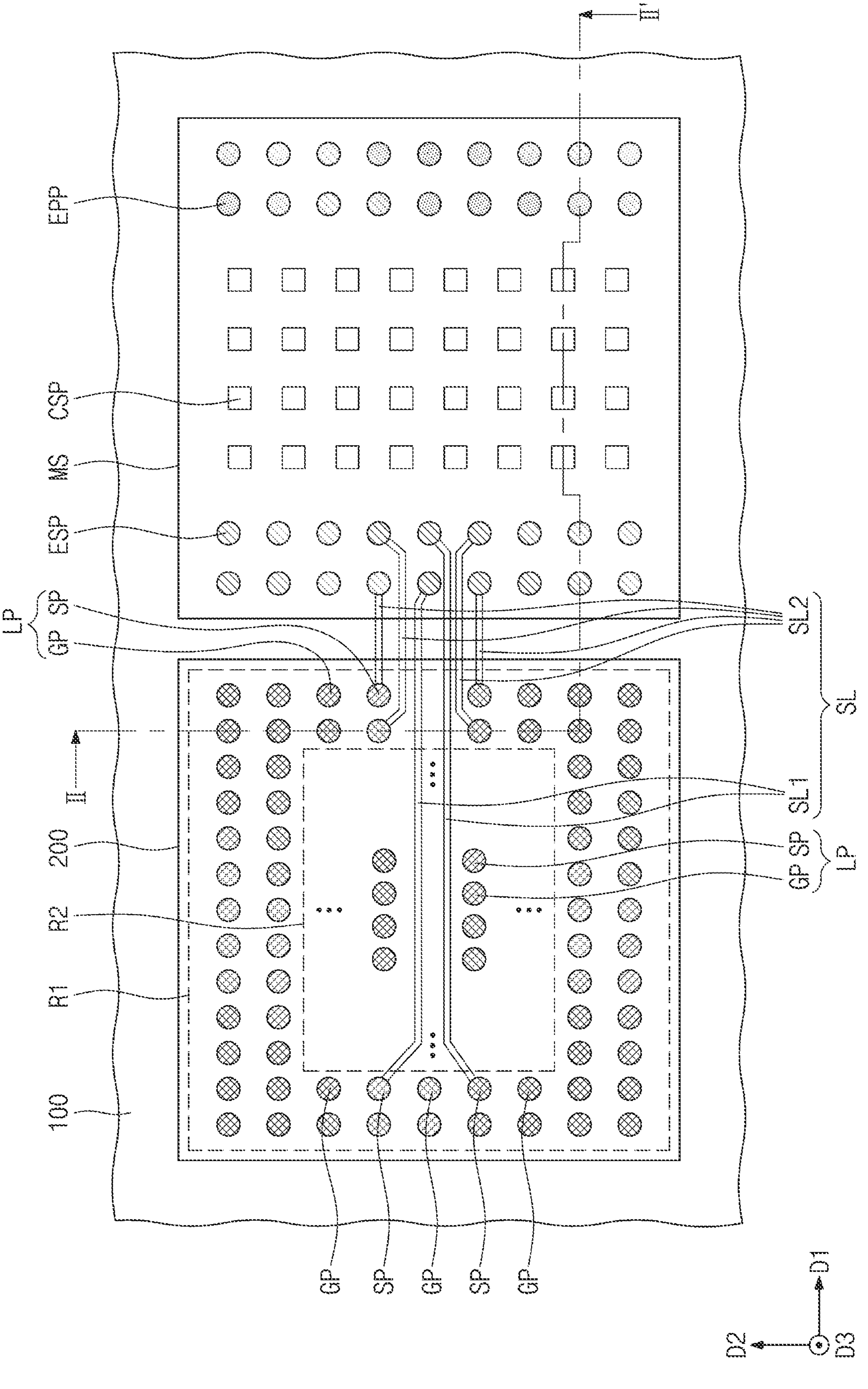
FIG. 5 illustrates a plan view showing another example of a semiconductor package.
Figure 6:
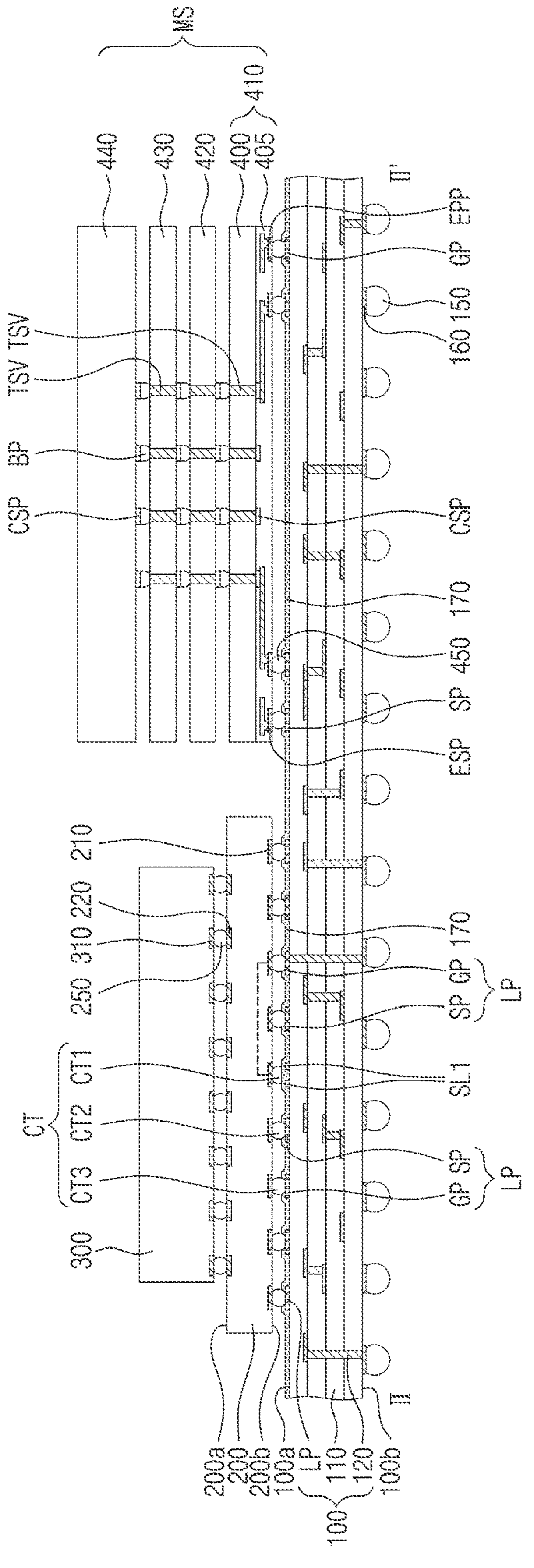
FIG. 6 illustrates an example cross-sectional view taken along line II-II' of FIG. 5.

FIG. 5 illustrates a plan view showing another example of a semiconductor package. FIG. 6 illustrates an example cross-sectional view taken along line II-II' of FIG. 5.

Referring to FIGS. 5 and 6, an interposer substrate 200 may be disposed on a package substrate 100, and a semiconductor chip 300 may be disposed on the interposer substrate 200. The package substrate 100 may be provided thereon with a memory structure MS spaced apart in the first direction D1 from the interposer substrate 200 and the semiconductor chip 300. For example, the semiconductor chip 300 and the memory structure MS may be mounted side by side on the package substrate 100. For example, the semiconductor chip 300 may be a logic chip, and the logic chip may be substantially the same as that discussed above.

The package substrate 100 may include dielectric layers 110, conductive patterns 120, and pads LP. The interposer substrate 200 on the package substrate 100 may have lower pads 210 and upper pads 220, and may include a first region R1 and a second region R2 surrounded by the first region R1. The package substrate 100 and the interposer substrate 200 may be provided therebetween with connection terminals CT and a solder resist pattern 170. The package substrate 100, the interposer substrate 200, the connection terminals CT, and the solder resist pattern 170 may be substantially the same as those discussed in FIGS. 1 to 3B.

The memory structure MS may include first, second, third, and fourth memory chips 410, 420, 430, and 440 that are sequentially stacked. For example, the first, second, third, and fourth memory chips 410, 420, 430, and 440 may be a dynamic random access memory (DRAM).

The first, second, third, and fourth memory chips 410, 420, 430, and 440 may have substantially the same shape and size in a plan view. The fourth memory chip 440 may have a thickness greater than those of the first, second, and third memory chips 410, 420, and 430, but the present disclosure is not limited thereto. For example, the first memory chip 410 may further include an additional redistribution layer 405, compared with the second, third, and fourth memory chips 420, 430, and 440.

The first, second, and third memory chips 410, 420, and 430 may include through vias TSV. The through vias TSV may penetrate the first, second, and third memory chips 410, 420, and 430. The fourth memory chip 440 may not include the through vias TSV, but the present disclosure is not limited thereto.

Each of the first, second, third, and fourth memory chips 410, 420, 430, and 440 may include central signal pads CSP on a bottom surface thereof. The central signal pads CSP may be command input/output pads, access input/output pads, and/or data input/output pads of the first, second, third, and fourth memory chips 410, 420, 430, and 440. For example, the central signal pads CSP of the first, second, third, and fourth memory chips 410, 420, 430, and 440 may vertically overlap each other.

When the first memory chip 410 includes the redistribution layer 405, the central signal pads CSP may be covered with the redistribution layer 405. The redistribution layer 405 may include edge signal pads ESP and edge power pads EPP.

The edge signal pads ESP and the edge power pads EPP may be provided on a lower portion of the redistribution layer 405. The edge signal pads ESP may be electrically connected to the edge power pads EPP. The edge power pads EPP may be a pad to which a power voltage or a ground voltage is applied.

When viewed in plan, the edge signal pads ESP may be disposed adjacent to the interposer substrate 200 and the semiconductor chip 300. The central signal pads CSP may be disposed between the edge signal pads ESP and the edge power pads EPP. For example, the edge power pads EPP may be disposed farthest away from the interposer substrate 200 and the semiconductor chip 300. The present disclosure, however, is not limited thereto, and the edge signal pads ESP, the central signal pads CSP, and the edge power pads EPP may be provided and disposed in various ways based on design of a semiconductor package.

When viewed in plan, the signal pads SP of the package substrate 100 that overlap the memory structure MS may be disposed identically to the edge signal pads ESP. In addition, the ground pads GP of the package substrate 100 that overlap the memory structure MS may be disposed identically to the edge power pads EPP. For example, the edge signal pads ESP may vertically overlap the signal pads SP of the package substrate 100, and the edge power pads EPP may vertically overlap the ground pads GP of the package substrate 100.

Connection bumps BP may be provided between the first, second, third, and fourth memory chips 410, 420, 430, and 440. Although not shown, one or more underfill layers may fill between the first, second, third, and fourth memory chips 410, 420, 430, and 440. The connection bumps BP may be connected to the through vias TSV of the first, second, and third memory chips 410, 420, and 430. The first, second, third, and fourth memory chips 410, 420, 430, and 440 may be electrically connected through the connection bumps BP and the through vias TSV.

For example, the through vias TSV may be connected to the central signal pads CSP of the first, second, third, and fourth memory chips 410, 420, 430, and 440. Through the central signal pads CSP and the through vias TSV, the first, second, third, and fourth memory chips 410, 420, 430, and 440 may mutually communicate command signals, access signals, and/or data signals.

Memory connection terminals 450 may be provided between the first memory chip 410 and the package substrate 100. The memory connection terminals 450 may be provided between and electrically connect the edge signal pads ESP and the signal pads SP of the package substrate 100. The memory connection terminals 450 may be provided between and electrically connect the edge power pads EPP and the ground pads GP of the package substrate 100.

The signal pads SP connected to the interposer substrate 200 may be electrically connected through the conductive patterns 120 in the package substrate 100 to the signal pads SP connected to the edge signal pads ESP. Alternatively, some of the signal pads SP connected to the interposer substrate 200 may be electrically connected through the signal lines SL on the package substrate 100 to the signal pads SP connected to the edge signal pads ESP. Input/output signals may be received and transmitted between the semiconductor chip 300 and the memory structure MS through the signal lines SL and the conductive patterns 120 of the package substrate 100.

The interposer substrate 200 may have one lateral surface close to the memory structure MS, and some of the signal pads SP adjacent to the one lateral surface of the interposer substrate 200 may be connected to the second signal lines SL2. The interposer substrate 200 may have another lateral surface opposite to the one lateral surface close to the memory structure MS, and some of the signal pads SP adjacent to the another lateral surface of the interposer substrate 200 may be connected to the first signal lines SL1. The first signal lines SL1 may extend in the first direction D1, and may pass through the first region R1 and the second region R2 of the interposer substrate 200. The signal lines SL may be connected to the signal pads SP that are connected to the edge signal pads ESP. A structure of the package substrate 100 may be simplified due to the signal lines SL, and the semiconductor chip 300 and the memory structure MS may be disposed side by side on the package substrate 100, with the result that a compact-sized semiconductor package may be provided. In addition, the first connection terminal CT1 may be positioned on the first signal lines SL1, and may be electrically connected through the interposer substrate 200 to the third connection terminal CT3 adjacent thereto. Therefore, a crosstalk may be prevented between signals applied to the signal pads SP adjacent to the first signal lines SL1.

In some implementations, a semiconductor package according to some embodiments of the present inventive concepts may include a signal line on a package substrate. Thus, as the package substrate has a simplified structure, the package substrate may have a small size. Accordingly, the semiconductor package may become compact-sized.

Moreover, a connection terminal between signal pads and on the signal line may be grounded thorough a ground pad adjacent thereto. A crosstalk may thus be prevented between signals applied to the signal pads. Accordingly, it may be possible to prevent a crosstalk of the semiconductor package.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Although the present disclosure has been described in connection with the implementations of the present disclosure illustrated in the accompanying drawings, it will be understood to those skilled in the art that various changes and modifications may be made without departing from the technical spirit and essential feature of the present disclosure. It therefore will be understood that the implementations described above are just illustrative but not limitative in all aspects.

What is claimed is:

1. A semiconductor package comprising:

a package substrate that includes a signal pad and a ground pad;

an interposer substrate on the package substrate;

a semiconductor chip on the interposer substrate;

a plurality of signal lines on a top surface of the package substrate; and a first connection terminal between the package substrate and the interposer substrate, wherein each signal line of the plurality of signal lines extends in a first direction, wherein the plurality of signal lines and the signal pad are spaced apart in a second direction that intersects the first direction, wherein the plurality of signal lines, the signal pad, and the ground pad are in contact with the top surface of the package substrate, and wherein the first connection terminal overlaps at least a portion of the plurality of signal lines in a plan view.

2. The semiconductor package of claim 1, comprising a solder resist pattern between the package substrate and the interposer substrate, wherein the solder resist pattern covers the plurality of signal lines and exposes at least a portion of the signal pad and at least a portion of the ground pad.

3. The semiconductor package of claim 1, wherein the first connection terminal is vertically spaced apart and electrically insulated from the plurality of signal lines.

4. The semiconductor package of claim 1, comprising:
a second connection terminal on the package substrate, the second connection terminal connected to the signal pad; and
a third connection terminal on the package substrate, the third connection terminal connected to the ground pad.

5. The semiconductor package of claim 4, wherein the first connection terminal is electrically connected, through the interposer substrate, to the third connection terminal.

6. The semiconductor package of claim 4, wherein a width of the first connection terminal is greater than a width of the second connection terminal or a width of the third connection terminal.

7. The semiconductor package of claim 4, wherein a thickness of the first connection terminal is less than a thickness of the second connection terminal or a thickness of the third connection terminal.

8. The semiconductor package of claim 1, wherein
the semiconductor package comprises a plurality of semiconductor chips including the semiconductor chip, and
at least one semiconductor chip of the plurality of semiconductor chips includes a logic chip.

9. The semiconductor package of claim 1, wherein the interposer substrate includes a first region and a second region,
wherein the first region surrounds the second region in a plan view, and
wherein each signal line of the plurality of signal lines extends from the first region to the second region.

10. The semiconductor package of claim 1, wherein a width of the first connection terminal is in a range of about 200 μm to about 300 μm.

11. A semiconductor package comprising:
a package substrate that includes a two-dimensionally arranged plurality of pads;
an interposer substrate on the package substrate;
a plurality of signal lines, each signal line of the plurality of signal lines extending in a first direction on the package substrate;
a solder resist pattern that covers the plurality of signal lines and a top surface of the package substrate;
a plurality of first connection terminals between the interposer substrate and the plurality of signal lines; and
a plurality of second connection terminals between the interposer substrate and the two-dimensionally arranged plurality of pads,
wherein at least a portion of the solder resist pattern is between the plurality of first connection terminals and the plurality of signal lines, and
wherein the plurality of signal lines are electrically insulated from the plurality of first connection terminals.

12. The semiconductor package of claim 11, wherein each pad of the two-dimensionally arranged plurality of pads vertically overlaps a corresponding second connection terminal of the plurality of second connection terminals.

13. The semiconductor package of claim 11, wherein a thickness of a first connection terminal of the plurality of first connection terminals is less than a thickness of a second connection terminal of the plurality of second connection terminals.

14. The semiconductor package of claim 11, wherein
the two-dimensionally arranged plurality of pads include a signal pad and a ground pad, and
at least one pad of the two-dimensionally arranged plurality of pads that is closest to the signal pad is the ground pad.

15. The semiconductor package of claim 11, wherein the two-dimensionally arranged plurality of pads and the plurality of signal lines are in contact with the top surface of the package substrate.

16. A semiconductor package comprising:
a package substrate that includes a plurality of signal pads and a plurality of ground pads on a top surface of the package substrate;
a logic chip on the package substrate;
an interposer substrate between the logic chip and the package substrate, the interposer substrate including a first region and a second region;
a plurality of signal lines between the interposer substrate and the package substrate;
a solder resist pattern that covers the plurality of signal lines; and
a plurality of connection terminals between the interposer substrate and the package substrate,
wherein the first region surrounds the second region in a plan view,
wherein the plurality of signal lines extend from the first region to the second region, and
wherein at least one connection terminal of the plurality of connection terminals vertically overlaps the plurality of signal lines.

17. The semiconductor package of claim 16, comprising a memory structure on the package substrate and horizontally spaced apart from the logic chip,
wherein at least one signal line of the plurality of signal lines electrically connects the logic chip and the memory structure.

18. The semiconductor package of claim 17, wherein the memory structure includes a plurality of memory chips and a plurality of through vias, the plurality of through vias extending through the plurality of memory chips.

19. The semiconductor package of claim 16, wherein at least one connection terminal of the plurality of connection terminals that vertically overlap the plurality of signal lines is electrically connected, through the interposer substrate, to at least one ground pad of the plurality of ground pads.

20. The semiconductor package of claim 16, wherein the package substrate includes a plurality of stacked dielectric layers and a plurality of conductive patterns in the plurality of stacked dielectric layers.

* * * * *